United States Patent [19]

Kovalchik et al.

[11] 4,408,283

[45] Oct. 4, 1983

[54] TIME DIVISION MULTIPLIER TRANSDUCER WITH DIGITALLY DERIVED PHASE SHIFT ADJUSTMENT FOR REACTIVE POWER AND ENERGY MEASUREMENT

[75] Inventors: Donald P. Kovalchik, Galloway; Frank E. Battocletti, Columbus, both of Ohio

[73] Assignee: TransData, Inc., Dublin, Ohio

[21] Appl. No.: 271,375

[22] Filed: Jun. 8, 1981

[51] Int. Cl.³ .............................................. G01R 21/06
[52] U.S. Cl. ................................... 364/483; 364/703; 328/160; 324/142
[58] Field of Search .............. 364/842, 483, 571, 703; 324/142; 328/160, 161

[56] References Cited

U.S. PATENT DOCUMENTS

| | | | |
|---|---|---|---|
| 3,465,136 | 9/1969 | Dailey et al. | 364/842 |
| 3,500,200 | 3/1970 | Woodhead | 324/142 |
| 3,610,910 | 10/1971 | Udall | 328/160 X |
| 3,746,851 | 7/1973 | Gilbert | 324/142 X |
| 3,794,917 | 2/1974 | Martin et al. | 324/142 |
| 3,818,206 | 6/1974 | Brunner et al. | 324/142 X |
| 3,955,138 | 5/1976 | Milkovie | 324/142 X |
| 3,959,724 | 5/1976 | Chana et al. | 324/142 |
| 3,975,682 | 8/1976 | Mayfield | 324/142 |
| 3,976,942 | 8/1976 | Mayfield | 324/142 |
| 4,015,140 | 3/1977 | Milkovie | 307/229 |
| 4,055,804 | 10/1977 | Mayfield | 324/142 |
| 4,056,775 | 11/1977 | Milkovie | 324/142 |
| 4,074,194 | 2/1978 | Wilkerson | 324/142 |
| 4,118,787 | 10/1978 | Arnoux | 364/842 |

OTHER PUBLICATIONS

A High Accuracy Time Division Multiplier, E. A. Goldberg, RCA Review, vol. XIII, pp. 265-274, Sep., 1952.

An Accurate Electronic Multiplier, Sternberg, RCA Review, pp. 618-634, Dec., 1955.

Evaluation of the Response of Time-Division Multipliers to A.C. and D.C. Input Signals, IEEE Transactions on Instrumentation in Measurement, R. Bergeest & P. Seyfried, vol. 1 M-24, No. 4, pp. 296-299, Dec., 1975.

*Primary Examiner*—Edward J. Wise
*Attorney, Agent, or Firm*—Mueller and Smith

[57] ABSTRACT

A power transducer of a variety utilizing time division multiplication and wherein the output of a time division converter is directed to an N position digital circuit such as a shift register or random access memory driven by an incrementing or clock input of predetermined frequency. The pulse train input is replicated at the digital circuit and directed to a parameter responsive switching circuit for carrying out actuation thereof following which filtering is provided to derive a product characterized output.

39 Claims, 5 Drawing Figures

TIME DIVISION MULTIPLIER TRANSDUCER WITH DIGITALLY DERIVED PHASE SHIFT ADJUSTMENT FOR REACTIVE POWER AND ENERGY MEASUREMENT

BACKGROUND OF THE INVENTION

The utilities and principal power consuming industries, for an extensive period of time, have made use of transducers serving to evaluate or meter a broad variety of the parameters of measurement of electricity. Such parameters will include, inter alia, a.c. current, a.c. voltage, frequency, watts, vars, Q, watthours, varhours, Q hours, phase and power factor. When employed by industry, the transducers generally are provided having an input associated with power lines through isolation and scaling components, for example voltage and/or current transformers. Operating upon these inputs, the transducers then provided outputs, which, preferably, are present as linearly scaled currents which, for example, may be suitable as signals introduced to a data acquisition system such as a computer or some form of less elaborate recording instrumentation. Where the parameters are units of power, a multiplication must be carried out by the transducers, for example, watt monitoring signals represent the product of voltage and current.

Early technical approaches taken to develop power monitoring signals initially involved the use of thermally responsive coil elements and the like, the temperatures of which could be converted to outputs corresponding with power. A lack of convenience and accuracy with such techniques led to interest in the utilization of Hall effect devices as multiplers wherein a voltage-proportional generated magnetic field and current were associated to provide a voltage output proportional to the product of current and voltage. Transducers may also utilize an electronic arrangement serving to capitalize upon the exponential transfer characteristic of solid-state devices to carry out multiplication. However, for power monitoring applications these solid-state techniques exhibit an accuracy which is lower than desired.

Another technique for produce derivation currently popular in the industry utilizes the system concept of time division multiplication. For example, the multiplier produces a pulse waveform whose amplitude is proportional to one variable, whose length relative to period is a function of another variable, and whose average value is proportional to the product of the two variables. Early investigations of the use of electronic time division multipliers are reported upon in the following publications which are incorporated herein by reference:

I. E. A. Goldberg, "A High Accuracy Time Division Multiplier", *RCA Review*, Volume XIII, pp. 265–274, September, 1952.

II. Sternberg, "An Accurate Electronic Multiplier", *RCA Review*, pp. 618–634, December, 1955.

III. R. Bergeest and P. Seyfried, "Evaluation of the Response of Time-Division Multipliers to A.C. and D.C. Input Signals", IEEE Transactions on Instrumentation In Measurement, Vol. 1 M-24, No. 4, pp. 296–299, December, 1975.

Time division multiplier networks generally are configured having a pulse width modulation circuit which is fed one of two input parameters and a switching circuit, usually controlled by the output signal of the modulator. As described in publication III above, the modulation circuits may be configured to operate in accordance with any one of three principles. In a first of these principles, the modulation factor is proportional to an input quantity. Accordingly, the pulse or sampling frequency is variable in accordance with input amplitude and an integration procedure is resorted to. In a second principle, the modulation factor remains proportional to an input parameter, but the sampling frequency does not depend upon input amplitude and thus is fixed. With such an arrangement, integration is not required. The third principle looks to the input parameter charging of capacitor associated with the utilization of a reference current discharge thereof and comparator detection. As in the second principle, no integration is carried out.

For any of the above principles elected by the designer of a transducer utilizing time division multiplication, the voltage input transformers inherently will evoke a phase shift of the incoming signal and the dictates of design accuracy require that such error be corrected. Further, where power factor related output signals are developed by the transducers, then a select phase shift, for example of 60° to 90° must be made available in the transducer design. Generally, the common technique for providing a phase shift correction, for example, into the integration stage of a transducer operating in accordance with the first principle, is to provide a separate compensation circuit which evokes a phase shift without a gain. While such phase shift correction can be achieved, the separate circuits involved have been observed to introduce their own errors into the entire transducer system design. Thus, difficulties conventionally encountered with amplifiers or the like, i.e. offset voltages, temperature occasioned excursions, and similar phenomena, are introduced with the result of loss of accuracy and reliability.

SUMMARY

The present invention is addressed to power evaluating apparatus such as power transducers utilizing a time division multiplication approach and providing a highly accurate phase adjustment. This phase adjustment is digital in nature and, thus, remains immune from the errors otherwise encountered with analog adjustment systems. The phase adjustment approach of the invention also enjoys the attributes of wide flexibility in selecting desired phase shifts, i.e. 60° or 90° as well as in carrying out phase error corrections encountered at monitoring and scaling components.

A further object and feature of the invention is to provide power evaluating apparatus having first monitoring means for receiving a first signal corresponding with a first monitored electrical parameter as well as second monitoring means for receiving a second signal corresponding with a second monitored electrical parameter. A time division converter circuit is provided which is responsive to the first signal for deriving a pulse width modulated pulse train signal corresponding therewith at an output. A switching circuit is provided which is coupled with the second monitoring means and which is actuable to selectively convey the second signal. A low pass filter is provided which is connectable with the switching circuit for receiving the conveyed second signal therefrom and which derives a product categorized power evaluating signal. Phase adjustment is carried out through the use of an N position digital circuit having an input coupled with the time division converter output and which is responsive to clock or incrementing inputs at a sampling frequency, $f_c$, for substantially replicating the pulse width modulated pulse train continuously at an output thereof to effect a predetermined time delay of that pulse train. This time delay achieves the desired phase adjustment. An oscillator is provided having an output coupled with the digital network or circuit for generating the clock or incrementing inputs and an arrangement for coupling the digital network or circuit with the switching circuit to effect the actuation of the latter in correspondence with the replicated pulse train is provided.

Another feature and object of the invention provides the above-described power evaluating apparatus utilizing one or more N stage or position shift registers as the digital circuit. This shift register may operate with an oscillator present as a crystal controlled oscillator or in conjunction with a phase locked loop network.

A further object of the invention provides the above-described power evaluating apparatus utilizing one or more N stage or position random access memories operating with an address counter network. The latter network can be driven at the desired sampling frequency either by a cyrstal controlled oscillator or a phase locked loop network.

Another object of the invention provides the oscillator as a phase locked loop network which is responsive to line frequency and which is coupled between the input to and output of either the shift register or the address counters which are associated with random access memory utilized for the digital phase shifting arrangement.

Other objects of the invention will, in part, be obvious and will, in part, appear hereinafter.

The invention, accordingly, comprises the apparatus possessing the construction, combination of elements and arrangement of parts which are exemplified in the following disclosure.

For a fuller understanding of the nature and objects of the invention, reference should be had to the following detailed description taken in connection with the accompanying drawings.

DETAILED DESCRIPTION

Figure 1:
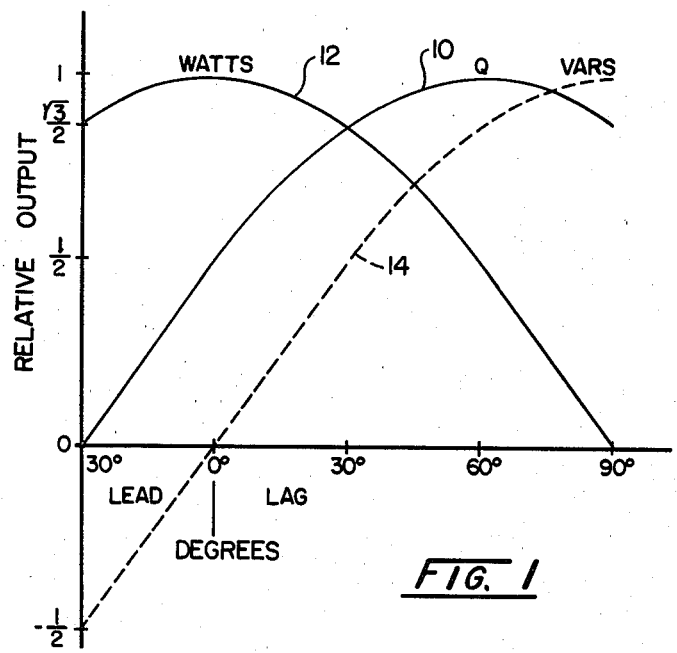
FIG. 1 shows a family of curves illustrating the useful range of a transducer showing values of Qs, vars, and watts.

Referring to FIG. 1, a graphic indication of the considerable value of a transducer system having a capability for substantial and accurate phase adjustment is revealed. The curves therein illustrate the useful range of a typical Q-hour transducer, the Q value output thereof being represented by curve 10, the watt curve being represented at 12 and a var curve being represented at 14. Q is defined as volts×amperes×cos ($\theta$-60°), while vars are defined as volts×amperes×cos ($\theta$-90°). The characteristic of the transducer represented by the curves shows that where Q is monitored, all Q values as well as watt values are positive from 30° leading (0.866 power factor leading) to 90° lagging (0 power factor lagging). The Q output signal of the transducer system is converted to var reactive power by straightforward computation, as represented by the following expression:

$$\text{vars} = (2Q - \text{watts})/\sqrt{3} \text{ and}$$

$$\text{reactive energy } var\text{hours} = 2(Q\text{hours} - \text{watthours})/\sqrt{3}$$

Observing the var characteristic curve 14, it may be noted that a var characteristic corresponding with a Q characteristic over the expected range of power factor in a typical utility system has a negative aspect. Where varhour data is required, without more, two output signals would be required because of the negative relative output for leading power factor conditions. Accordingly, for installations wherein the output of the transducer is recorded on magnetic tracks, a selective 60° phase may be utilized to record Qhour values from which varhour may be derived. All such Qhour values represent positive quantities over the power factor range typically encountered. Such data generally are introduced to computers which can carry out the computations required to achieve corresponding varhour valuations with relative ease.

Figure 2:
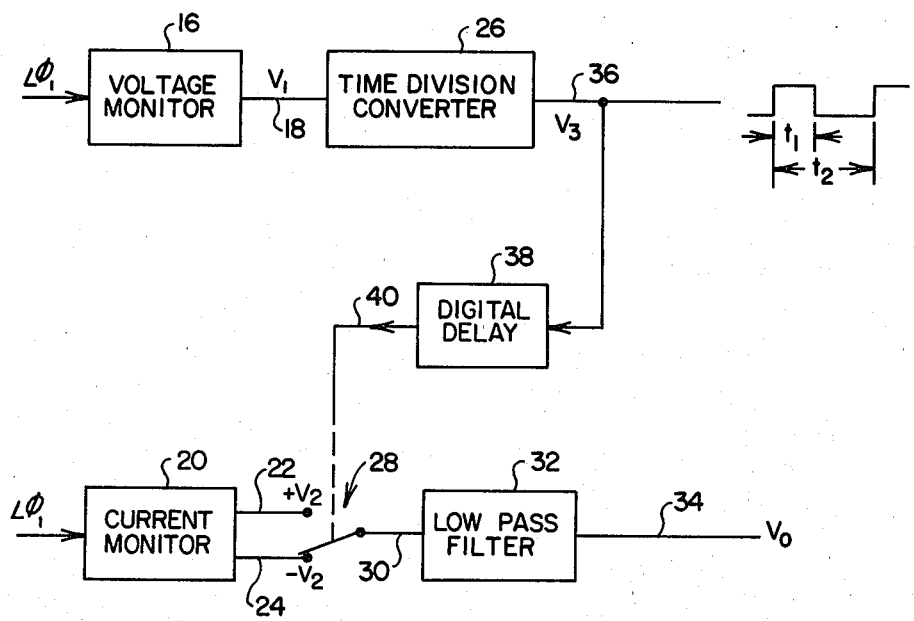
FIG. 2 is a generalized block diagrammatic representation of a transducer according to the invention.

Looking to FIG. 2 a block schematic representation of a transducer utilizing any of the above three enumerated principles of time division multiplication is represented in block schematic fashion. Generally, the line being evaluated for watts or reactive power is monitored or tapped for determining each of two electrical parameters, for example, voltage and current. Accordingly, voltage monitoring for the instant representation as well as the scaling of the resultant signal by a transformer or the like is represented at block 16. This scaled output is represented at line 18 which is further labeled $v_1$. Because of the use of a transformer in scaling or the like, the voltage, E, of the monitored line may be represented as having a phase $\phi_1$, while, following monitoring and scaling, the voltage at line 18 may be represented as now having a phase $\phi_2$ correspondwith a small error which ultimately requires some form of correction. Heretofore, such correction for phase at this position was made at line 18 by analog circuits, however, such error accommodation now may be evolved inherently with the instant invention.

Correspondingly, a second electrical parameter, i.e. current, is monitored and scaled as represented at block 20. As before, the line current so monitored, I, is represented as having a phase characteristic at an angle of $\theta_1$, which characteristic for the scaled output at lines 22 and 24, respectively labeled $+v_2$ and $-v_2$ may be represented as the current I having a slightly altered phase angle $\theta_2$.

In conventional manner, with time division multiplication, a waveform is generated whose amplitude is proportional to one electrical parameter and whose time division is proportional to the other. The average value of the waveform represents multiplication. In the representation of FIG. 2 time division of the waveform is carried out in accordance with the any of the above principles and this time division is represented at block 26, that block being shown receiving the voltage monitor signal, $v_1$, at line 18. Time division converter function 26 produces a pulse width modulated pulse train output, $v_3$, such that the duty cycle thereof, $(t_1-t_2)/(t_1+t_2)$ will be equal to some constant, R, times the input voltage, i.e. the following expression obtains:

$$(t_1-t_2)/(t_1+t_2)=kv_1.$$

This pulse train ultimately is utilized to actuate a voltage controlled switching circuit represented generally at 28. Switching circuit 28, thus actuated in accordance with the above duty cycle, serves alternately to introduce the voltage signals at lines 22 and 24 along line 30 and through a low-pass filter represented at block 32 to provide a product characterized output signal at line 34 represented as $v_0$.

In accordance with the instant invention, the output of time division converter function 26 at line 36 which carries a signal designated $v_3$, is introduced to the input of a digital delay function represented at block 38. At function 38, a highly precise time delay is imposed upon the pulse train, the interval of delay of which may be selected to correct any phase errors evolved, for example, at voltage monitor 16, as well as to insert a predetermined delay to achieve a phase shift of 60° for deriving a Q categorized output or a shift of 90° to evolve a var categorized output. Accordingly, the delayed pulse train from function 38 at line 40 is utilized to actuate switch function 28 to achieve this highly desired and accurate result. The output signal $v_0$ at line 34 then is phase adjusted by an angle $\theta$ and may be represented as follows:

$$v_0 = v_1 v_2 \angle \theta$$

The implementation of the digital delay represented at block 38 is by an N position digital circuit which may take several forms, for example, the delay may be provided by a shift register, alternately, by a conventional random access memory. Clocking inputs to either of these components may be provided by a crystal controlled oscillator or through the utilization of phase locked loop techniques. These implementations are described in enhanced detail in the discourse to follow.

Figure 3:
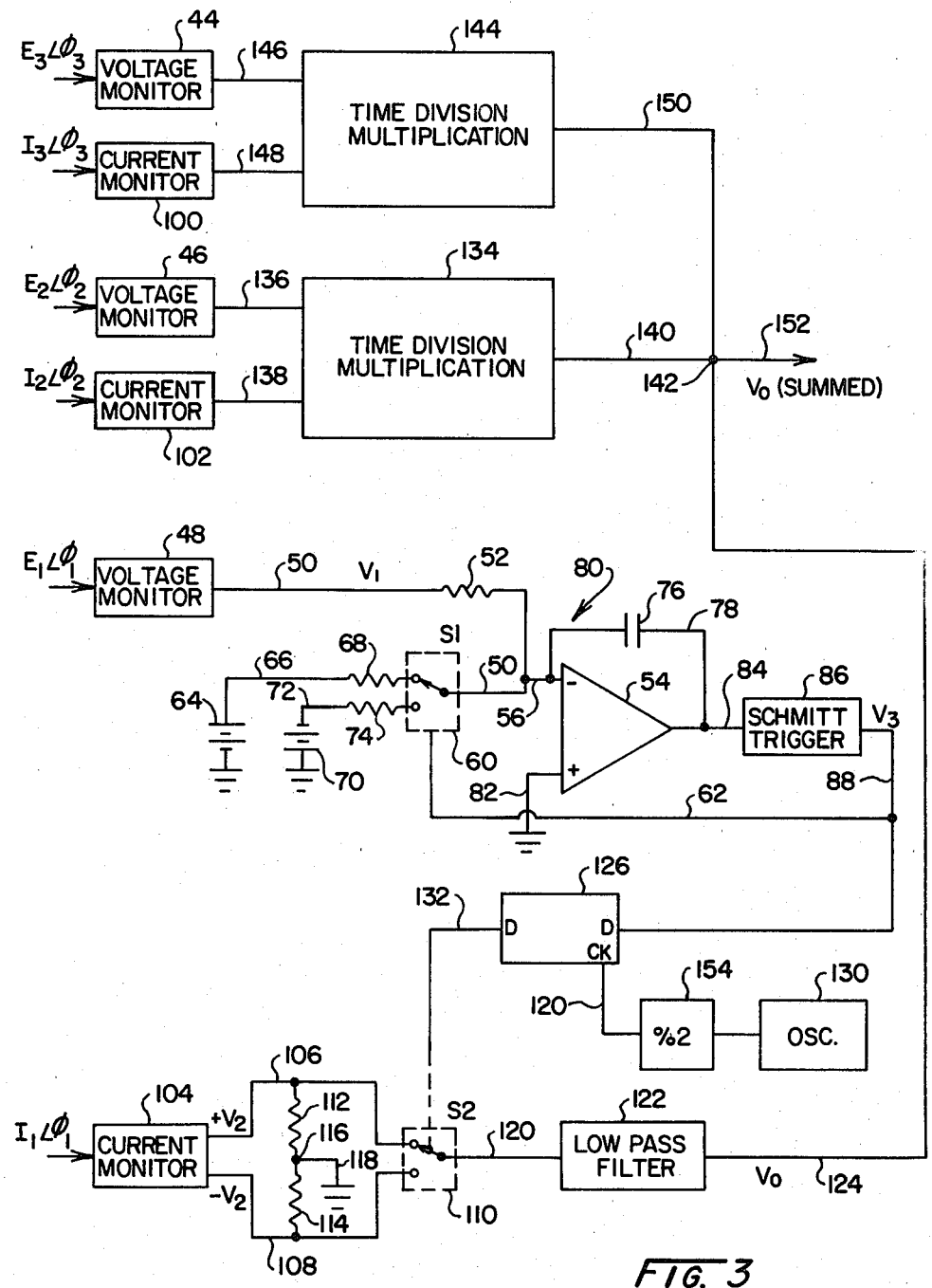
FIG. 3 is a circuit drawing of a transducer according to the invention with repetitive portions thereof shown in block diagrammatic fashion.

Referring to FIG. 3, a three-channel transducer suited, for example, for developing watt and var categorized output signals is revealed. Each of the three channels contains an electrical parameter monitor, for example, a voltage monitor as earlier described and again represented by blocks as at 44, 46, and 48. The circuitry within these discrete channels is identical, thus, only that associated with voltage monitor function 48 is described in detail. Voltage monitor function 48 operates in conjunction with a time division converter function of a variety utilizing an integration stage operating in conjunction with a trigger having a hysteresis characteristic. In this regard a signal from function 48 is impressed along line 50 incorporating an input resistor 52 which is directly coupled to the inverting, negative terminal input of an operational amplifier 54 from along line 56. Also coupled to line 56 is the output line 58 of a voltage controlled switch S1 or the equivalent thereof positioned within dashed boundary 60 and controlled by voltage signal levels deriving from line 62. Switching function S1 provides a reference voltage at line 58 in consequence of its alternate connection or suitable association with a reference voltage source 64 which is coupled with the switch through line 66 incorporating resistor 68. Similarly, a negative reference voltage is provided from source 70 which is coupled to switch S1 through line 72 and resistor 74. A variety of techniques for implementing the above will occur to those skilled in the art at hand.

Operational amplifier 54 is operatively associated with a capacitor 76 within a feedback line 78 to operate as an integrator stage represented generally at 80. In keeping with conventional integrator design, the non-inverting or positive terminal input of amplifier 54 is coupled to ground as represented at line 82. The output of integrator stage 80 at line 84 is directed to the input of a dual threshold Schmitt trigger represented at 86 and the output thereof is represented at line 88 which is labeled $v_3$. Trigger 86 performs having select positive and negative threshold switching levels responding to the input at line 84. Inasmuch as line 62 is coupled to line 88, this output is applied to or operates in conjunction with voltage controlled switch function S1 to effect the actuation thereof.

The current monitoring function of the instant transducer embodiment is represented for a three-phase device at blocks 100, 102, and 104. Looking in particular to the detailed implementation of the output of current monitor 104, such monitoring generally is provided by a transformer, the outputs of which are connected through lines 106 and 108 to the poles of a voltage controlled switching circuit, S2 represented within dashed boundary 110. Lines 106 and 108 carry the labeled signals $v_2$ of opposite polarity by virtue of their connection with resistors 112 and 114 within line 116, the center tap between which is coupled to ground through line 118. These signals will exhibit a phase error with respect to line power and, alternately, are passed through switching circuit S2 to line 120 which is coupled to the input of a low pass filter 122, the latter providing a product signal output $v_0$ at line 124. Switch S2 ultimately is driven by the alternating output voltage $v_3$ at line 88. However, in accordance with the instant invention, that train of switch actuating pulses is delayed in time very accurately by an N position digital circuit, for example, a serial, static shift register having a bit capacity adequate to achieve the delay desired. Such a shift register, for example, may be a type SY2533 marketed by Synertek, Inc., Santa Clara, Calif. The shift register is shown at 126 having its D input terminal coupled with line 88. This 1,024 bit register is clocked by a pulse train input to its clock, CK, terminal emanating from line 128 which is coupled, in turn, to the output of a crystal control oscillator represented at block 130. The corresponding output of shift register 126 is present at line 132 which is arranged in driving relationship with voltage controlled switch S2. With the arrangement shown, a highly accurate delay corresponding, for example to a 90° phase shift may be derived at register 126 by appropriate selection of the clock input sampling frequency at oscillator 130. This delay also may accommodate for the phase error inherently developed in the monitoring and scaling inputs to the apparatus. The delay which is selected will equal the number, N, of bits or positions, for example 1,024 divided by the frequency at the clock input from line 128. Thus, the sampling frequency, $f_c$, will be equal to 360° divided by the desired number of degrees of phase shift multiplied by N and the line frequency, $f_{in}$, i.e. the following expression obtains:

$$f_c = \left(\frac{360°}{X°} \times N\right) f_{in}$$

where X° is the desired phase shift.

Not considering phase error correction, providing a digitally derived time delay for Q categorized readouts involves the following relationship between bit or position capacity, N and sampling frequency:

$$f_c = 6Nf_{in}$$

Similarly, the relationship between these selective variables for var categorized readouts becomes:

$$f_c = 4Nf_{in}$$

For a 90° phase shift the resultant delay would equal 1/240 of a second assuming a 60 Hertz line frequency. In selecting the sampling frequency imposed from line 128, consideration also must be made to deriving an adequate sample rate with respect to the pulses applied from trigger 86 at line 88. To evolve an accurate delineation of pulse width, such a sampling frequency should be at least twice the smallest width of such pulses. This consideration also requires that the number of bits, N, must be sufficiently large to evolve the desired delay at the necessary sampling frequency. By utilizing a digital delay format, the accuracy of the transducer may be considerably enhanced, to an extent well beyond the 0.10% accuracy achieved with analog approaches. In particular, the digital domain approach avoids difficulties otherwise generated due to temperature effects and the like. Because use of the transducers is in conjunction with utility derived line power, the 60 Hertz frequency of the system generally is sufficiently accurate to permit the use of a shift register as at 126 in conjunction with a crystal controlled oscillator generating an independent clock input thereto.

The remaining two channels of the transducer of FIG. 3 are shown in generalized fashion, for example, that channel utilizing monitors 46 and 102 is represented as having a time division multiplication network 134 which is identical to that described above. In this regard block 134 is shown being fed from voltage monitor 46 from along line 136, while the multiplication function is shown being addressed by current monitor 102 from along line 138. The output of the multiplication function 134 is represented at line 140 which, in turn, leads to a summing point 142. In similar fashion, time division multiplication function 144 is connected with voltage monitor 44 through line 146 and with current monitor 100 through line 148. The output of multiplication function 144 is present at line 150 which, in turn, leads to summing point 142. The output of the entire three-channel transducer apparatus is represented at line 152 showing an output $v_0$ (summed).

Calibration of transducer devices, standards and the like is carried out readily through the utilization of a digital delay approach. For example, the output of crystal controlled oscillator 130 may be divided, for example by 2, where a 90° phase shift is normally developed. As represented at dashed boundary 154, by dividing the output of oscillator by 2, a 180° phase shift is evolved which permits very fascile adjustment of the circuit by conventional nulling techniques against a watt standard or the like.

Figure 4:
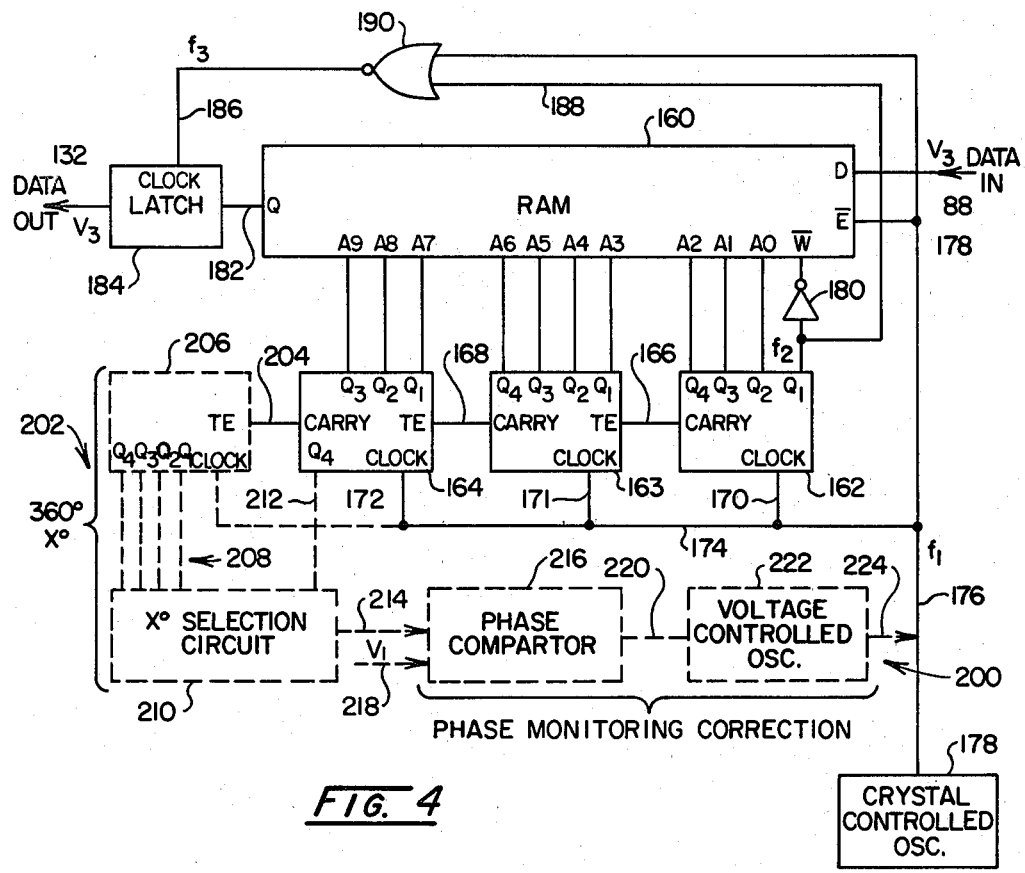
FIG. 4 is a schematic circuit drawing showning an alternative arrangement for compnents of the circuit of FIG. 3.

Turning to FIG. 4, an embodiment of the invention wherein a random access memory device is utilized to carry out digital delay is schematically illustrated. In the figure, lines 88 and 132 as described in conjunction with FIG. 3 are reproduced, however, they are shown respectively leading into and from the D and Q terminals of an N bit or position static random address memory (RAM) 160. This RAM may, for example, be of a 1024×1 bit variety. The read-write terminal $\overline{W}$, the enable terminal $\overline{E}$ as well as the address terminals $A_0$–$A_9$ of RAM 160 are coupled with the appropriate output terminals of a series of cascade connected synchronous programmable counters 162–164. In this regard, note that the carry output of counter 162 is coupled with the T-enable input TE, of counter 163 through line 166, while a similar coupling at line 168 interconnects counters 163 and 164. The clock inputs to counters 162–164 are connected via respective lines 170–172 to line 176 which, in turn, is coupled to a crystal controlled oscillator represented at block 178. With the connections thus provided, a carry look-ahead counting network is evolved. The frequency provided by oscillator 178 is labeled $f_1$ and that line is shown directed through line 178 to the enable, $\overline{E}$, terminal of RAM 160. Similarly, the $Q_1$ output of counter 162 is labeled as carrying the signal, $f_2$, and is coupled to the read-write terminal, $\overline{W}$ of RAM 160 through an inverter 180. The Q output of RAM 160 is coupled through line 182 to a latch 184 which may be present, for example, as a conventional flip-flop. The clock input of latch 184 receives a signal at line 186, designated $f_3$ which is derived from the frequency, $f_1$ of oscillator 178 at line 176 combined with the $Q_1$ output, $f_2$ of counter 162 through a NOR gate 190.

As is apparent, oscillator function 178 corresponds with that at 130 as shown in FIG. 3. Counters 162–164, may, for example, be present as type MC14163 marketed by Motorola Semiconductor Products, Inc., Austin, Tex.

Figure 5:
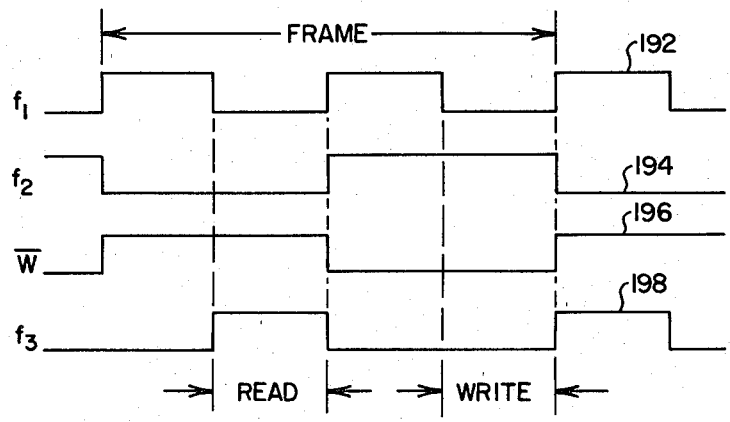
FIG. 5 shows a family of timing curves associated with the circuit of FIG. 4.

Looking additionally to FIG. 5, with the arrangement thus shown, a frame extending over operational time, t, is represented above timing diagram 192 representing the output, $f_1$, of crystal controlled oscillator 178. During a designated "frame", a read cycle and a write cycle are carried out with respect to a given one of the address ports $A_0$–$A_9$ of RAM 160. The $Q_1$ output, $f_2$, of counter 162 is represented at timing curve 194 and the inverted version thereof which is directed to the write terminal $\overline{W}$ of RAM 160 is represented at timing curve 196. A resultant output of NOR gate 190, designated $f_3$, is shown at curve 198 and this curve shows the function of latch 184 as being that of holding the information representing a last bit read at output line 182. In operation, for each read cycle and write cycle for a given address terminal of RAM 160, the information which may be present at such terminal ultimately is read out as data out at line 132, while the incoming new information is read into that address. The delay interval then is defined by the time period required to progress through the entire series of address ports $A_0$–$A_9$. Again, the delay interval is determined by the output of crystal controlled oscillator 178 along with the position or address value, N, and a very high accuracy due to the digital domain approach is achieved. As before, the clock frequency is selected in accordance with the desired phase alteration and with respect to line freuency. RAM 160 may, for example, be a type 146508 marketed by Motorola Semiconductor Products, Inc. (supra).

Where a three-channel transducer is contemplated as described in conjunction with FIG. 3, additional RAMS as at 160 may be utilized, or, RAM 160 may be present as, for example, a 1,024×4-bit variety. In the latter regard, 1,024×3-bit structures are not currently available. With such a multi-channel approach, only one network of counters 162-164 need be employed.

Where the frequency of the line power being monitored may vary, it is desirable that the clock or sampling frequency be arranged to remain proportional to the input or line frequency. Accordingly, for the shift register embodiment shown in FIG. 3 or for the RAM 160 embodiment of FIG. 4, the crystal controlled oscillators 178 or 130 may be replaced with a phase monitoring and correction circuit represented generally in phantom or dashed-boundary fashion at 200. Additionally shown in general and in phantom at 202 is a divider and phase selection circuit. This circuit represents the value 360°/X° used as described above in deriving the sampling frequency, $f_c$. Looking in more detail to network 202, it may be observed that the carry output of counter 164 is directed via line 204 to the T-Enable port, TE, of a similar counter represented in phantom at 206. The clock input of counter 206 is coupled with line 174, while the $Q_1$-$Q_4$ outputs thereof are shown being directed via line grouping 208 to a X° degree selection circuit represented by dashed boundary 210. With the arrangement shown, the selection circuitry 210 elects which of the outputs $Q_1$-$Q_4$ of divider 206 is to be used for purposes of submittal to phase monitoring and correction network 200. The non-dividing frequency signal input to circuit 210 is shown extending from the $Q_4$ output of counter 164 and is represented by dashed line 212. Accordingly, by appropriate operator selection, any desired division or non-division may be carried out through conventional election circuits. The output of circuit 210 is represented at dashed line 214 which is directed to one input of phase monitoring and correction network 200. For the instant embodiment, network 200 may be present as a phase locked loop. Conventional in structure, the phase locked loop is seen to include a phase comparator represented at dashed block 216 which is arranged to receive the line frequency signal $v_1$ as developed, for example at line 50 in FIG. 3 and which now is represented at line 218. Receiving inputs from lines 214 and 218, the comparator 216 will develop a voltage output at dashed line 220 which is directed to and serves to establish the frequency output of a voltage controlled oscillator represented by dashed block 222, that output being at dashed line 224 which is coupled with line 176. With the arrangement shown, a very accurate tracking of line frequency is achieved by the device, while the delay imposed by the digital circuit achieves a phase shift, X°.

Since certain changes may be made in the above described apparatus without departing from the scope of the invention herein involved, it is intended that all matter contained in the description thereof or shown in the accompanying drawings shall be interpreted as illustrative and not in a limiting sense.

We claim:

1. Power and energy evaluating apparatus, comprising:
   first monitoring means for providing a first signal corresponding with a first monitored electrical parameter;
   second monitoring means for providing a second signal corresponding with a second monitored electrical parameter;
   time division converter means responsive to said first signal for deriving a pulse width modulated pulse train signal corresponding therewith at an output;
   filter means means for selectively receiving said second signal for deriving a product categorized power evaluating signal;
   N position digital circuit means having an input coupled with said time division converter output and responsive to clock inputs at sampling frequency, $f_c$, for substantially replicating said pulse width modulated pulse train signal continuously at an output thereof to effect a select time delay of said pulse train;
   oscillator means having an output coupled with said digital circuit means for generating said clock inputs; and
   switching circuit means coupled with said second monitoring means and to said digital circuit means output and actuable in response to said replicated pulse train signal to effect the application of said second signal to said filter means.

2. The apparatus of claim 1 in which:
   said digital circuit means comprises at least one N stage shift register; and
   said oscillator means is a crystal controlled oscillator.

3. The apparatus of claim 2 in which:
   said first and second monitoring means respective first and second electrical parameters occur at a given line frequency, $f_{in}$; and
   said sampling frequency, $f_c$, is selected substantially as: $4Nf_{in}$.

4. The apparatus of claim 3 including divider means manually actuable and coupled with said oscillator means output for dividing said sampling frequency, $f_c$, in half prior to the submittal thereof to said digital circuit.

5. The apparatus of claim 2 in which:
   said first and second monitoring means respective first and second electrical parameters occur at a given line frequency, $f_{in}$; and
   said sampling frequency, $f_c$, is selected substantially as:

$$\left(\frac{360°}{X°} \times N\right) f_{in},$$

where X° is a selected phase shift in degrees.

6. The apparatus of claim 1 in which:
   said first and second monitoring means respective first and second electrical parameters occur at a given line frequency, $f_{in}$; and
   said sampling frequency, $f_c$, is selected substantially as: $6Nf_{in}$.

7. The apparatus of claim 1 in which:
   said digital circuit means comprises at least one N stage shift register;
   said first and second monitoring means respective first and second electrical parameters occur at a given line frequency, $f_{in}$; and
   said oscillator means comprises a phase monitoring and correction network responsive to said line frequency, $f_{in}$ and coupled between the intput to and output of said shift register for deriving said sampling frequency, $f_c$, in synchronism with said line frequency, $f_{in}$.

8. The apparatus of claim 1 in which:

said digitial circuit means comprises at least one N stage serial shift register;

said first and second monitoring means respective first and second electrical parameters occur at a given line frequency, $f_{in}$; and said oscillator means comprises a phase comparator having inputs responsive to the output of said shift register and said given line frequency, $f_{in}$, for deriving a voltage control signal, and a voltage controlled oscillator responsive to said voltage control signal for deriving said sampling frequency, $f_c$, in synchronism with said line frequency, $f_{in}$.

9. The apparatus of claim 8 in which said voltage controlled oscillator is configured to provide said sampling frequency, $f_c$, substantially as: $4Nf_{in}$.

10. The apparatus of claim 8 in which said voltage controlled oscillator is configured to provide said sampling frequency, $f_c$, substantially as: $6Nf_{in}$.

11. The apparatus of claim 8 in which:

said first and second monitoring means respective first and second electrical parameters occur at a given line frequency, $f_{in}$; and said sampling frequency, $f_c$, is selected substantially as:

$$\left(\frac{360°}{X°} \times N\right) f_{in},$$

where $X°$ is a selected phase shift in degrees.

12. The apparatus of claim 1 in which said digital circuit means comprises:

random access memory means having a data in terminal coupled with said time division converter output, a data out terminal present as said digital circuit means output, a plurality of address terminals selectively addressable with respect to N memory locations, and read-write terminal means actuable for effecting a write operation with respect to a select said memory location and a read operation with respect to select said memory location; and address counter means having a plurality of outputs coupled with corresponding said memory means address terminals and said read-write terminal means and actuable in response to said oscillator means clock inputs to read and write data corresponding with said pulsewidth modulated pulse train sequentially along said N memory locations to effect said replication thereof from said data out terminal.

13. The apparatus of claim 12 including:

latch means coupled with said data out terminal and responsive to the initial said output of said address counter means and to said oscillator means clock inputs for selectively retaining read outputs of said data out terminal.

14. The apparatus of claim 12 wherein said oscillator means is a crystal controlled oscillator.

15. The apparatus of claim 14 in which:

said first and second monitoring means respective first and second electrical parameters occur at a given line frequency, $f_{in}$; and said sampling frequency, $f_c$, is selected substantially as: $4Nf_{in}$.

16. The apparatus of claim 15 including divider means manually actuable and coupled with said oscillator means output for dividing said sampling frequency, $f_c$, in half prior to the submittal thereof to said digital circuit.

17. The apparatus of claim 14 in which:

said first and second monitoring means respective first and second electrical parameters occur at a given line frequency, $f_{in}$; and said sampling frequency, $f_c$, is selected substantially as: $6Nf_{in}$.

18. The apparatus of claim 14 in which:

said first and second monitoring means respective first and second electrical parameters occur at a given line freqency, $f_{in}$; and said sampling frequency, $f_c$, is selected substantially as:

$$\left(\frac{360°}{X°} \times N\right) f_{in},$$

where $X°$ is a selected phase shift in degrees.

19. The apparatus of claim 12 in which:

said first and second monitoring means respective first and second electrical parameters occur at a given line frequency, $f_{in}$; and said oscillator means comprises a phase monitoring and correction network responsive to said given line frequency, $f_{in}$ and coupled between the input to and the output of said address counter means for deriving said sampling frequency, $f_c$, in synchronism with said given line freuqency, $f_{in}$.

20. The apparatus of claim 19 including:

second counter means coupled in cascade fashion with said address counter means for deriving binary division signals of a predetermined output thereof; and phase shift selection circuit means for receiving a select said binary division signal for submittal to said phase monitoring and correction network.

21. The apparatus of claim 19 in which said sampling frequency, $f_c$, is selected substantially as: $4Nf_{in}$.

22. The apparatus of claim 19 in which said sampling frequency, $f_c$, is selected substantially as: $6Nf_{in}$.

23. The apparatus of claim 19 in which:

said first and second monitoring means respective first and second electrical parameters occur at a given line frequency, $f_{in}$; and said sampling frequency, $f_c$, is selected substantially as:

$$\left(\frac{360°}{X°} \times N\right) f_{in},$$

where $X°$ is a selected phase shift in degrees.

24. The apparatus of claim 12 in which:

said first and second monitoring means respective first and second electrical parameters occur at a given line frequency, $f_{in}$;

said oscillator means comprises a phase comparator having inputs responsive to the output of said address counter means and to said given line frequency, $f_{in}$ for deriving a voltage control signal, and a voltage controlled oscillator responsive to said voltage control signal for deriving said sampling frequency, $f_c$, in synchronism with said line frequency, $f_{in}$.

25. A transducer for monitoring a power line exhibiting given power and phase characteristics at a given frequency, $f_{in}$, comprising:
   means for monitoring a first electrical parameter of said power line to derive a first scaled signal corresponding therewith;
   integrator stage means, including an amplifier having an inverting input responsive to said first scaled signal, for providing an integrated output;
   trigger means responsive to said integrated output for providing time variable actuating signals at an output thereof corresponding with said integrated output;
   means for monitoring a second electrical parameter of said power line to derive second and third signals of opposite polarity corresponding therewith;
   means for alternately effecting the application of first and second reference signals of opposed polarity to said amplifier inverting input in response to said time variable actuating signals;
   low pass filter means for selectively receiving said second and third scaled signals and providing a power responsive output;
   N position digital circuit means having an input coupled with said trigger means output and responsive to incrementing inputs at sampling frequency, $f_c$, for substantially replicating said time variable actuating signals continuously at an output thereof to effect a predetermined time delay thereof;
   oscillator means having an output coupled with said digital circuit means for generating said incrementing inputs; and
   switching circuit means coupled with said means for monitoring a second electrical parameter and to said digital circuit means output and actuable in response to said replicated time variable actuating signals to effect the application of said second and third scaled signals to said low pass filter means.

26. The transducer of claim 25 in which:
   said digital circuit means comprises at least one N stage shift register; and
   said oscillator means is a crystal controlled oscillator.

27. The transducer of claim 26 in which said sampling frequency, $f_c$, is selected substantially as: $4Nf_{in}$.

28. The transducer of claim 27 including divider means manually actuable and coupled with said oscillator means output for dividing said sampling frequency, $f_c$, in half prior to the submittal thereof to said digital circuit.

29. The transducer of claim 26 in which said sampling frequency, $f_c$, is selected substantially as: $6Nf_{in}$.

30. The transducer of claim 26 in which:
   said first and second monitoring means respective first and second electrical parameters occur at a given line frequency, $f_{in}$; and
   said sampling frequency, $f_c$, is selected substantially as:

$$\left( \frac{360°}{X°} \times N \right) f_{in},$$

where $X°$ is a selected phase shift in degrees.

31. The transducer of claim 25 in which:
   said digital circuit means comprises at least one N stage shift register; and
   said oscillator means comprises a phase locked loop network responsive to said frequency, $f_{in}$, and coupled between the input to and output of said shift register for deriving said sampling frequency, $f_c$, in synchronism with said frequency, $f_{in}$.

32. The transducer of claim 25 in which said digital circuit comprises:
   random access memory means having a data in terminal coupled with said time division converter output, a data out terminal present as said digital circuit means output, a plurality of address terminals selectively addressable with respect to N memory locations, and a read-write terminal means actuable for effecting a write operation with respect to a select said memory location and a read operation with respect to a select said memory location; and
   address counter means having a plurality of outputs coupled with corresponding said memory means address terminals and said read-write terminal means and actuable in response to said oscillator means incrementing inputs to read and write data corresponding with said time variable actuating signals sequentially along said N memory locations to effect said replication thereof at said data out terminal.

33. The transducer of claim 32 including:
   latch means coupled with said data out terminal and responsive to the initial said output of said address counter means and to said oscillator means clock inputs for selectively retaining read outputs of said data out terminal.

34. The transducer of claim 32 wherein said oscillator means is a crystal controlled oscillator.

35. The crystal controlled oscillator of claim 34 wherein said sampling frequency, $f_c$, is selected substantially as: $4Nf_{in}$.

36. The transducer of claim 35 including divider means manually actuable and coupled with said oscillator means output for dividing said sampling frequency, $f_c$, in half prior to the submittal thereof to said digital network.

37. The transducer of claim 32 wherein said sampling frequency, $f_c$, is selected substantially as: $6Nf_{in}$.

38. The transducer of claim 32 wherein said oscillator means comprises a phase monitoring and correction network responsive to said given frequency, $f_{in}$ and coupled between the input to and output of said address counter means for deriving said sampling frequency, $f_c$, in synchronism with said given line frequency, $f_{in}$.

39. The transducer of claim 38 including:
   second counter means coupled in cascade fashion with said address counter means for deriving binary division signals of a predetermined output thereof; and
   phase shift selection circuit means for selectively receiving a select said binary division signal for submittal to said phase monitoring and correction network.

* * * * *